(12) United States Patent
Jinno

(10) Patent No.: US 6,914,448 B2
(45) Date of Patent: Jul. 5, 2005

(54) TRANSISTOR CIRCUIT

(75) Inventor: Yushi Jinno, Gifu (JP)

(73) Assignee: Sanyo Electric Co., Ltd. (JP)

( * ) Notice: Subject to any disclaimer, the term of this patent is extended or adjusted under 35 U.S.C. 154(b) by 0 days.

(21) Appl. No.: 10/388,254

(22) Filed: Mar. 13, 2003

(65) Prior Publication Data

US 2004/0004218 A1 Jan. 8, 2004

(30) Foreign Application Priority Data

Mar. 15, 2002 (JP) ........................................ 2002-072248

(51) Int. Cl.$^7$ ............................................. G01R 31/26
(52) U.S. Cl. ........................................ 324/769; 324/765
(58) Field of Search ................................ 324/763–770, 324/73.1, 158.1; 315/169.1; 349/40, 54, 192; 345/93, 275; 327/278, 416, 524, 537

(56) References Cited

U.S. PATENT DOCUMENTS 4,851,827 A * 7/1989 Nicholas ...................... 345/93
6,307,322 B1 * 10/2001 Dawson et al. .......... 315/169.1

* cited by examiner

Primary Examiner—Vinh P. Nguyen
(74) Attorney, Agent, or Firm—Cantor Colburn LLP

(57) ABSTRACT

Transistor capacitance Cdtr inevitably generated between the gate and the drain of a second TFT is increased. Accordingly, an operation test of a first TFT and the second TFT can be conducted by turning on the first TFT to charge the transistor capacitance Cdtr and detecting the stored charges.

12 Claims, 5 Drawing Sheets

TRANSISTOR CIRCUIT

BACKGROUND OF THE INVENTION

1. Field of the Invention

The present invention relates to a transistor circuit for driving various elements, and more particularly to a transistor circuit having its operation and inspection test facilitated.

2. Description of the Related Art

Transistors are commonly used for controlling supply and output of electric current in display devices and sensors.

An example of a flat display panel is an organic EL display panel. An organic EL display panel is configured by arranging, in a matrix, a large number of pixels each composed of an organic EL element. One method for driving an organic EL element is the active matrix method in which a switching transistor is provided for each pixel, and display of each pixel is controlled by controlling the corresponding transistor.

FIG. 5 shows an example circuit configuration of a pixel in an organic EL panel employing conventional thin film transistors (TFT). An organic EL panel is configured by arranging such pixels in a matrix.

A gate line GL extending in a row direction is connected to the gate of a first TFT 10, which is an n-channel thin film transistor selected by the gate line GL. The drain of the first TFT 10 is connected to a data line DL extending in a column direction. The source of the first TFT 10 is connected to a storage capacitor CS, which in turn is connected on the other terminal with a capacitor line SL serving as a low-voltage power source. An intermediate point in the connection between the source of the first TFT 10 and the storage capacitor CS is connected to the gate of a second TFT 40, which is a p-channel thin film transistor. The source of the second TFT 40 is connected to a power line VL, while the drain of the second TFT 40 is connected to an organic EL element EL. The other terminal of the organic EL element EL is connected to a cathode power source CV.

According to this arrangement, when the gate line GL is at level H, the first TFT 10 is turned on. Data provided in the data line DL at that point is stored in the storage capacitor CS. A current in the second TFT 40 is controlled in accordance with the data (potential) stored in the storage capacitor CS. A current then flows in the organic EL element EL in accordance with the current in the second TFT 40, resulting in light emission.

When the first TFT 10 is turned on, a video signal associated with the pixel is supplied through the data line DL. As a result, the storage capacitor CS is charged in accordance with the video signal supplied through the data line DL. A corresponding current then flows in the second TFT 40, thereby executing brightness control of the organic EL element EL. In other words, display of gradation in each pixel is attained by adjusting the gate potential of the second TFT 40 so as to control the current flowing in the organic EL element EL.

In an organic EL panel as described above, a defect may occur during the manufacturing process of the panel in the two TFTs or other components constituting each pixel, resulting in a pixel that cannot execute predetermined display operations. It is difficult to perfectly prevent such point defects which inevitably occur with a predetermined probability. As a defect is visually unnoticeable when it merely generates a dark point in which no display is performed, a defective pixel is typically deactivated by disconnecting its wiring using a laser or the like.

To locate and disconnect defective pixels, it is necessary to conduct an operation test for each pixel. One method for conducting the operation test is to detect secondary electrons reflected by each pixel using a detector so as to confirm operation of the pixel. However, this method is inefficient, requiring a long testing time.

In the process of manufacturing an LCD, an array test is conducted at the point when a pixel electrode is formed, by turning on a switching element to apply a voltage to a storage capacitor and the pixel electrode, and checking the amount of electric charge stored in the storage capacitor. An array tester for this purpose has been developed.

When such an array test performed for an LCD is conducted with respect to an organic EL panel, the output of the first TFT can be tested. However, as one pixel of an organic EL panel includes two TFTs, a test of the second TFT to determine whether an electric current is adequately supplied to the organic EL element (such that light emission results) cannot be inspected.

SUMMARY OF INVENTION

An advantage of the present invention is that it provides an organic EL panel in which an operation test for each pixel can be conducted using an electrical charge measurement tester, so called array tester.

According to the present invention, parasitic and/or channel capacitance of a second transistor is increased. As a result, operation of the transistor can be confirmed by reading out charges stored in or discharged from the capacitance.

Further, operation of the transistor can be confirmed by configuring the parasitic and/or channel capacitance of the second transistor greater by a given degree compared to that of a storage capacitor, and reading out charges stored in or discharged from that capacitance.

It is preferable to increase the transistor capacitance by enlarging, in a planer direction, a portion of a channel region of the second transistor, such that the channel region is expanded while maintaining the channel width and channel length.

DESCRIPTION OF PREFERRED EMBODIMENTS

Preferred embodiments of the present invention will now be described with reference to the accompanying drawings.

Figure 1:
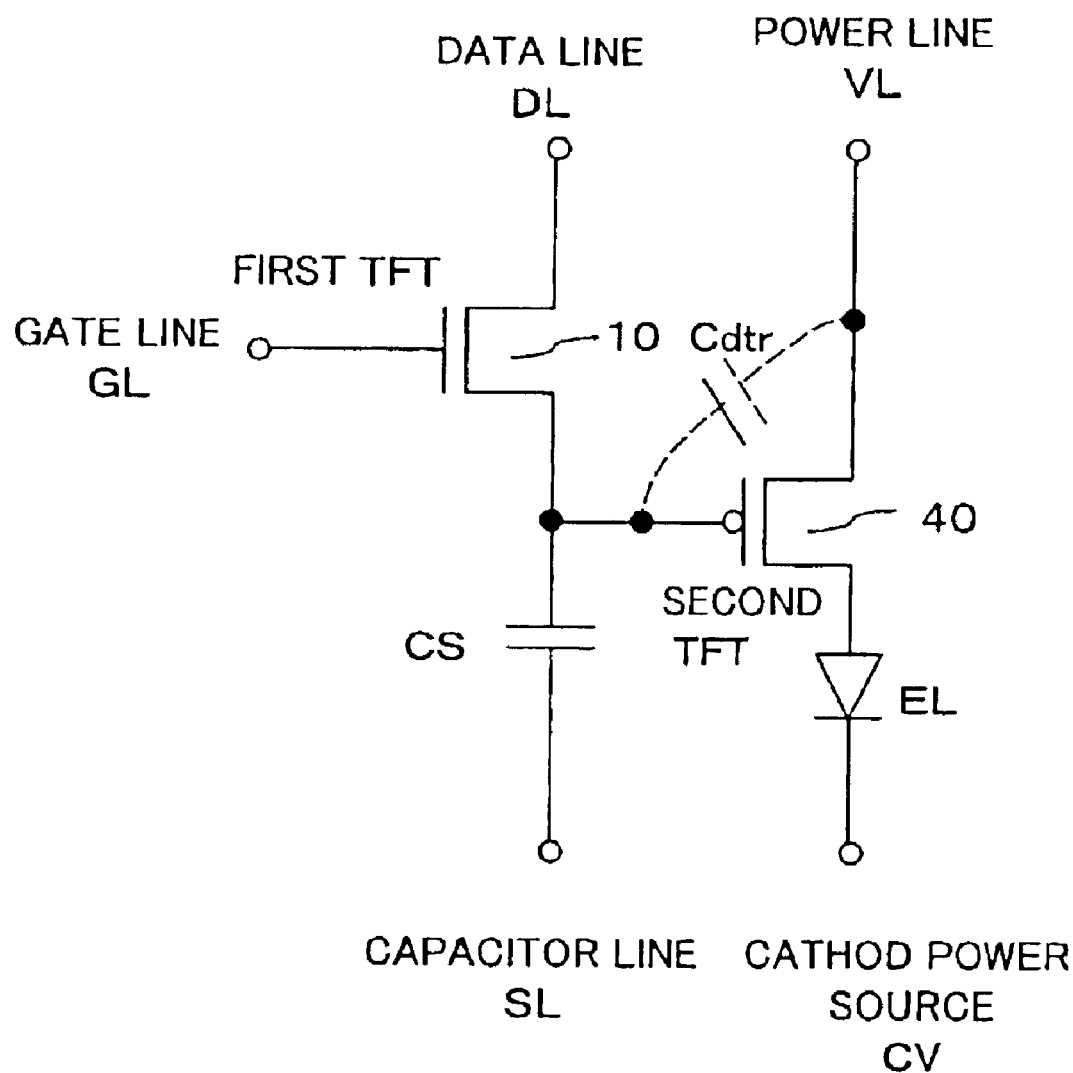
FIG. 1 is a circuit diagram illustrating an embodiment of the present invention.
Figure 5:
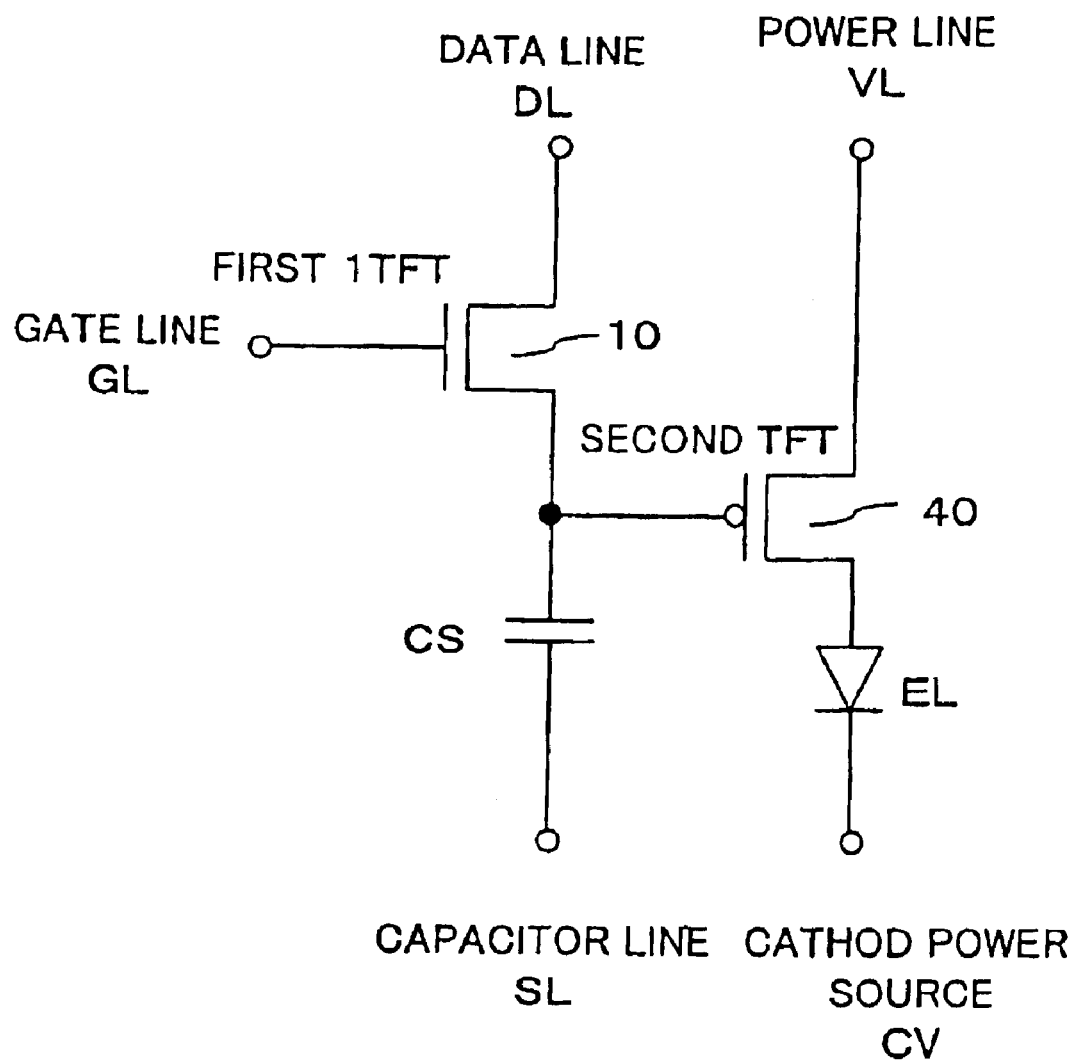
FIG. 5 is a diagram illustrating a prior art pixel circuit configuration.

FIG. 1 shows a transistor circuit configuration for one pixel in an organic EL display panel. As in FIG. 5, the pixel of FIG. 1 comprises a first TFT 10, a storage capacitor CS, a second TFT 40, and an organic EL element EL. Further, the second TFT 40 inevitably includes a capacitance, namely, transistor capacitance Cdtr between the gate and the source and/or channel area of the second TFT 40.

According to the present embodiment, a test for determining whether the first TFT 10 and the second TFT 40 operate normally is conducted by turning on the first TFT 10 to allow charges to be stored in or discharged from the storage capacitor CS and the transistor capacitance Cdtr, and detecting an alteration in the capacitance value of the transistor capacitance Cdtr.

As is known, it is possible to determine whether the first TFT 10 operates normally by applying a predetermined voltage to the data line DL, turning on the first TFT 10, and subsequently reading out the amount of stored charges supplied by the data line DL.

As the charge amount read out in this manner includes an amount of charges stored in or discharged by the transistor capacitance Cdtr, this read-out charge amount can be used to determined whether the transistor capacitance Cdtr is set at a designated level. For example, when the first TFT 10 is turned on and a voltage Vt is applied to the data line DL, the voltage at the connecting point between the second TFT 40 and the storage capacitor CS becomes Vt. At this point, assuming that the voltage Vt at the connecting point between the second TFT 40 and the storage capacitor CS generates a potential difference Vt1 with respect to the capacitor line SL and a potential difference Vt2 with-respect to the power line VL, the stored charge amount at the connecting point between the second TFT 40 and the storage capacitor CS is equal to Qt=(CS·Vt1)+(Cdtr·Vt2). Capacitance of the storage capacitor CS, Vt1 and Vt2 are known in advance. Accordingly, by detecting the stored charge amount Qt and subtracting from Qt the amount of charges stored in the storage capacitor CS, the amount of charges stored in the transistor capacitance Cdtr can be determined. Using this value, transistor capacitance Cdtr can be calculated.

When the gate is short-circuited with the source or the drain in a TFT, or the source, channel, or drain region is not properly formed, Vt1 and Cdtr are varied, resulting in an alteration in transistor capacitance and the amount of charges stored therein. In the present embodiment, it is determined whether operation of the second transistor 40 is normal, namely, whether the second transistor 40 performs normal display operations, by detecting the stored charge amount denoted by transistor capacitance Cdtr×Vt2.

The stored charge amount used for determining transistor capacitance Cdtr can be read out via the data line DL or via the power line VL. More specifically, after turning on the first TFT 10 to initially apply a gate voltage of level Vt to the second TFT 40, a stored charge amount may be detected using a current amount detector disposed in the data line DL while the gate voltage level is varied to a predetermined high or low voltage level. In this way, the amount Qt of charges stored while varying voltages Vt1 and Vt2 can be detected. Alternatively, as the power line VL is connected to the other end of the transistor capacitance Cdtr, the stored charge amount in the transistor capacitance Cdtr may be determined based on the amount of current that flows when the voltage of the power line VL is varied while maintaining the gate voltage of the second TFT 40 at Vt.

In the above-described inspection processes, it is noted that an alteration in transistor capacitance Cdtr cannot be properly detected when variances exist in the storage capacitors CS and when capacitance of a storage capacitor CS fluctuates with a change in potential of a signal line. Typically, capacitance of a storage capacitor CS is approximately 100 fF, while transistor capacitance Cdtr is approximately a few fF. The stored charge amount in a transistor capacitance Cdtr is therefore difficult to detect.

In light of the above, the present embodiment is configured such that transistor capacitance Cdtr of the second TFT 40 is increased compared to a conventional transistor capacitance. This increase is achieved according to the methods described below.

Method (i): transistor capacitance Cdtr can be increased by enlarging the channel area of the second TFT 40. Transistor capacitance Cdtr may be expressed as follows:

$$Cdtr = K \cdot Sdtr/ds$$

$$Sdtr = n \cdot Wdtr \cdot Ldtr$$

wherein K denotes a predetermined constant, Sdtr denotes the channel area, ds denotes a film thickness of the gate oxidation film, n denotes the number of second TFTs, Wdtr denotes a channel width, and Ldtr denotes a channel length.

According to the above equations, it is possible to increase transistor capacitance Cdtr by enlarging the total channel area.

Method (ii): transistor capacitance Cdtr can also be increased by reducing the film thickness ds of the gate oxidation film.

Using a method such as one of those described above, the transistor capacitance Cdtr is preferably increased to 5 fF or greater, and more preferably to 10 fF or greater. Further, reliable detection of transistor capacitance Cdtr can be performed by setting the ratio of Cdtr to the capacitance of the storage capacitor CS, namely, Cdtr/CS, to 5% or greater (and more preferably to 10% or greater).

Although execution of the operation test is further facilitated when this capacitance ratio is greater, the ratio cannot be made excessively high considering normal operations and circuit efficiency. The ratio should therefore be normally set to no greater than 20%.

It may be preferable to take a further positive measure to increase the transistor capacitance Cdtr.

Figure 2:
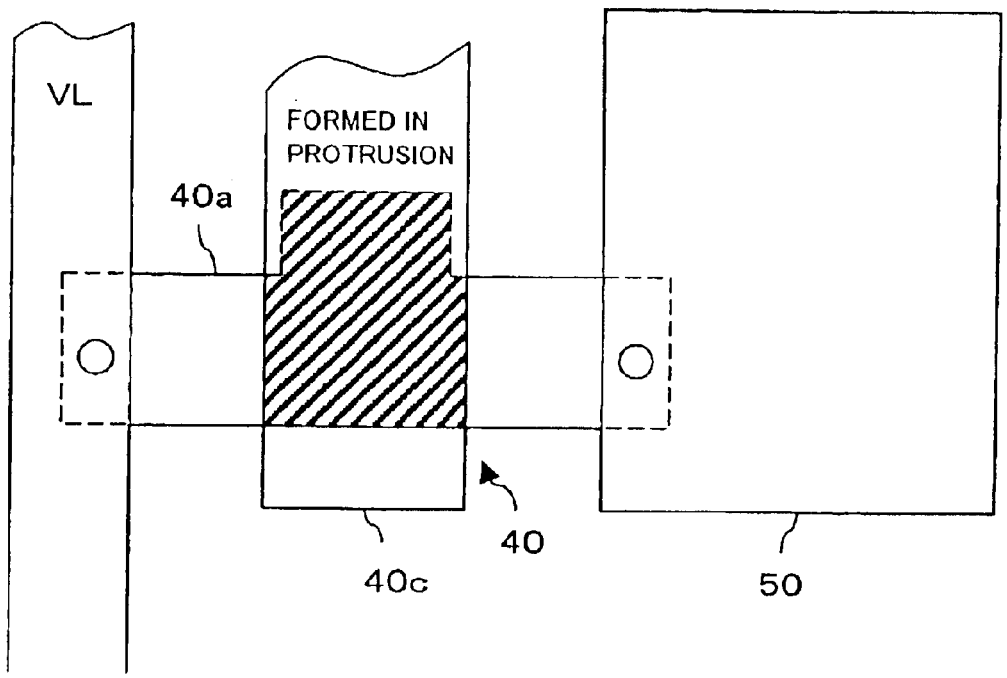
FIG. 2 shows an example configuration for increasing the capacitance of a second TFT.

FIG. 2 shows one example configuration of an active layer 40*a* composed of a material such as a polycrystalline silicon, in which the shape of the channel region is modified to increase its area. One end of the active layer 40*a* is connected to the power line VL, while the other end is connected to an anode 50. The TFT in this example is constituted with a top-gate structure in which a gate electrode is positioned above the active layer. A gate electrode 40*c* covers a center portion of the active layer 40*a*, with a gate insulation film disposed between the gate electrode 40*c* and the active layer 40*a*. The center portion of the active layer 40*a* constitutes the channel region, while the portions on both sides constitute the source and drain regions.

As shown in FIG. 2, a portion of the channel region is formed in protrusion beneath the gate electrode 40*c*, thereby enlarging the channel region area. By expanding the channel region under the gate electrode 40*c* in this manner, the transistor capacitance Cdtr can be increased without altering the performance of the second TFT.

Figure 3:
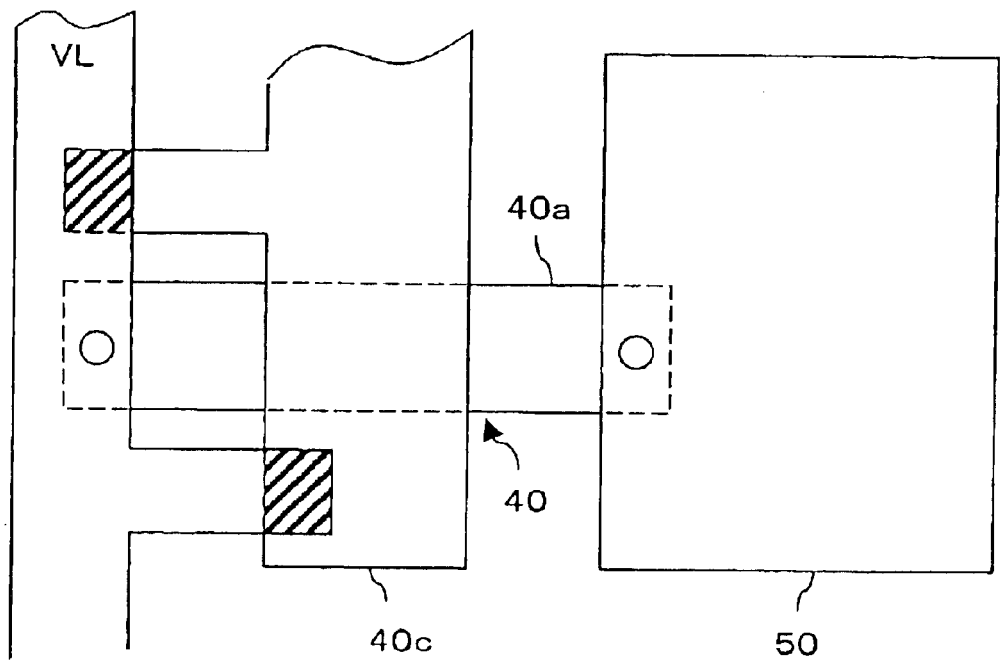
FIG. 3 shows another example configuration for increasing the capacitance of a second TFT.

FIG. 3 shows another example configuration. In this example, a portion of the gate electrode 40*c* that is not located above the active layer 40*a*, namely, a gate electrode portion located outside the second TFT 40, is extended such that it reaches under the power line VL. According to this arrangement, a portion of the gate line 40*c* is opposed to the power line VL via an interlayer insulation film, generating capacitance therein.

Further, the power line VL may be extended over the gate electrode 40*c*. More specifically, a portion of the power line VL that is not located above the active layer 40a, namely, a power line portion located outside the second TFT 40, may be extended such that it reaches above the gate electrode 40c. In this manner, portions of the power line VL and the gate line 40c are opposed to one another via an interlayer insulation film, generating capacitance therein.

Figure 4:
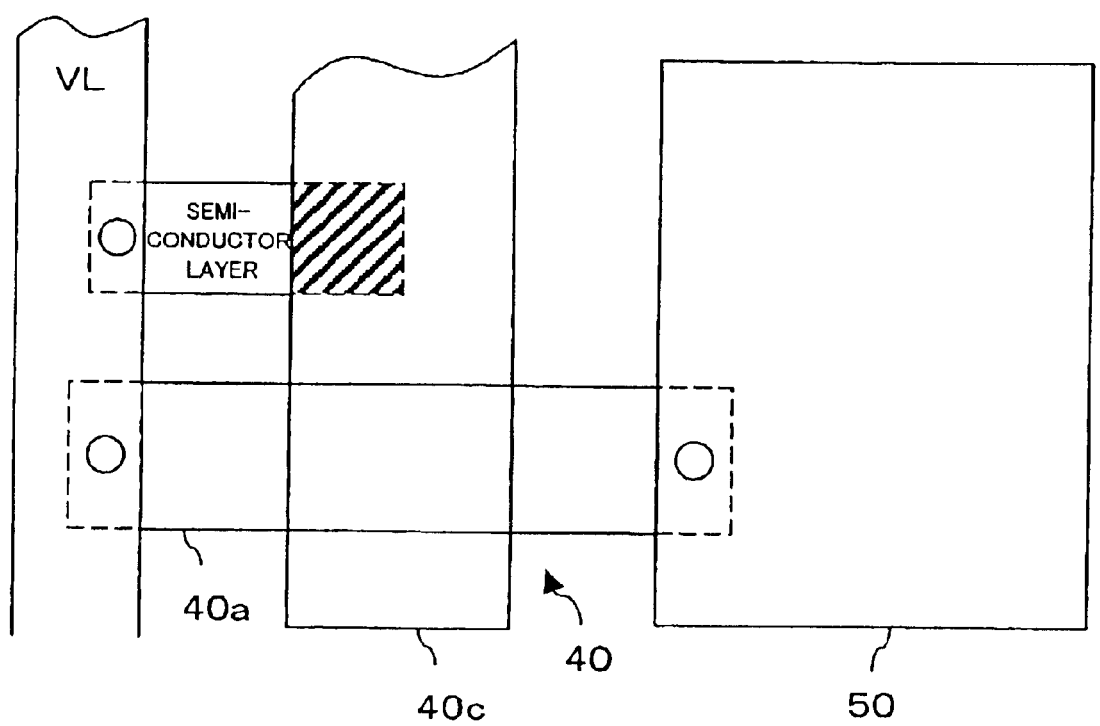
FIG. 4 shows a further example configuration for increasing the capacitance of a second TFT.

FIG. 4 shows a further example configuration. In this example, a semiconductor layer composed of a material identical to that of the active layer 40a such as polycrystalline silicon is formed simultaneously with but discretely from the active layer. One end of the semiconductor layer is connected to the power line VL using a contact structure similar to that employed for connection between the active layer 40a and the power line VL. The other end of the semiconductor layer is extended such that it reaches under the gate electrode 40c. According to this arrangement, the semiconductor layer having one end connected to the power line VL is positioned underneath the gate electrode 40c with anoxidation film (gate oxidation film) interposed there between. Although the semiconductor layer located under the gate electrode 40c is not doped with impurities, capacitance is generated by the structure wherein the semiconductor layer is opposed to the gate electrode 40c via the gate oxidation film. An area of the semiconductor layer opposed to the gate electrode (channel) maybe a little doped by impurity. This doping is called channel dope. An area other than channel of the semiconductor lay is doped by impurity for reducing its resistance.

As described above, the transistor capacitance Cdtr of the second TFT 40 can be positively increased by adopting the configurations of FIGS. 2–4. When a second TFT 40 as described above is included in the pixel circuit structure, operation of the pixel can be tested by detecting the increased transistor capacitance Cdtr.

In particular, the operation test may be conducted before superposing the organic layer of the organic EL element EL. More specifically, the test can be performed before the anode 50 is formed, at the point when the first and the second TFT and the wiring lines GL, DL, VL, and SL are completed. Any faulty pixel found (especially a defective pixel that emits light) can be subsequently treated using a laser to, for example, disconnect a defective wiring portion or connect a disconnected portion.

When forming an organic EL element, a second planarization film 60 is deposited after forming the anode 50, thereby allowing any holes created by laser to be filled with the second planarization film 60. This eliminates any drawbacks which may be caused by remaining unevenness in the product generated by laser cutting and laser direct wiring.

Figure 6:
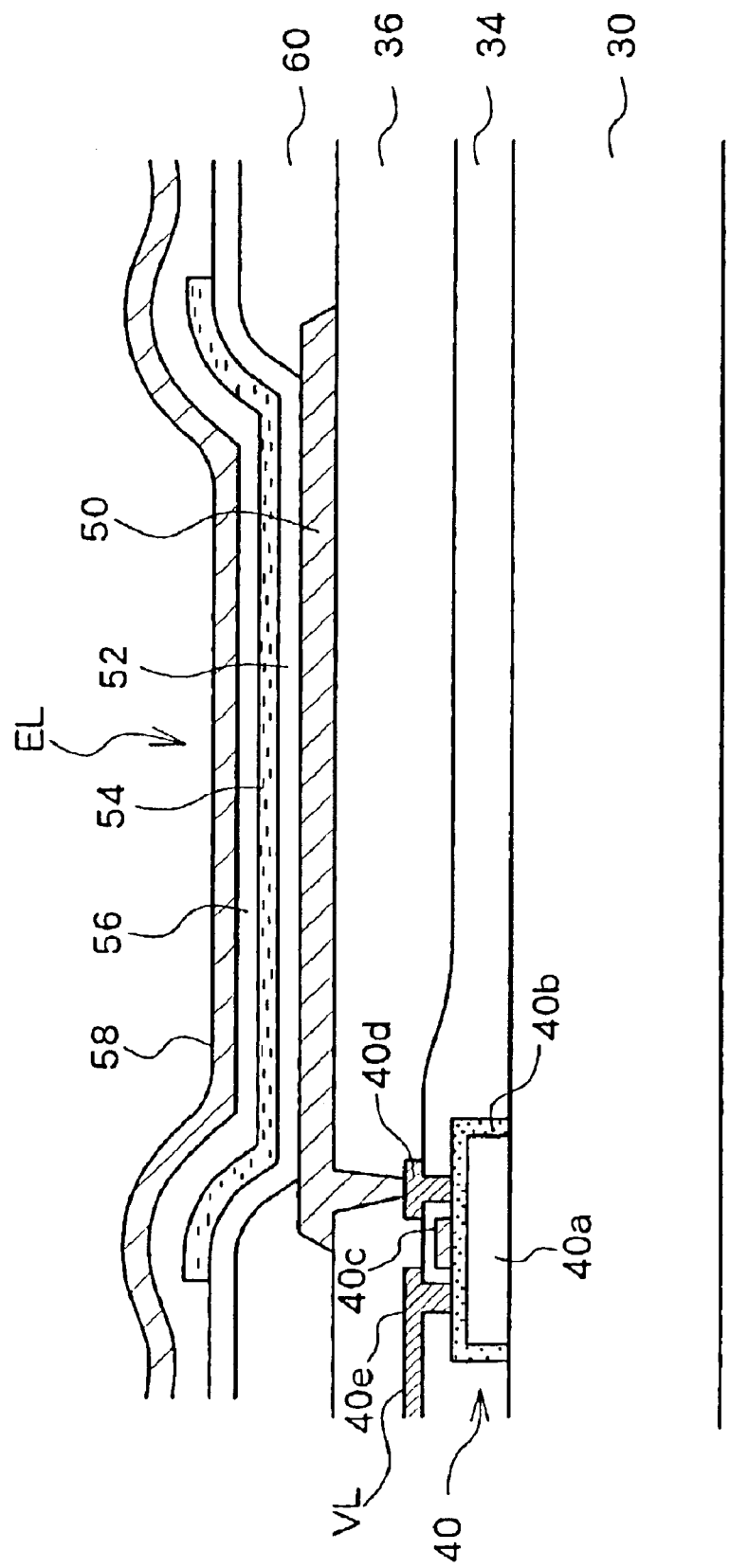
FIG. 6 is a cross-sectional view of a pixel portion.

FIG. 6 shows a cross-sectional structure of the second TFT 40 and the organic EL element EL. As can be seen, the second TFT 40 formed on a glass substrate 30 includes an active layer 40a composed of a low-temperature polysilicon. The right and left portions of the active layer 40a are doped with impurities and constitute source and drain regions, respectively. The central portion between the source and drain regions serves as a channel region. A gate electrode 40c is formed over the channel region, with a gate insulation film 40b composed of silicon oxide interposed therebetween. The gate insulation film 40b and the gate electrode 40c are covered with an interlayer insulation film 34. Formed on the right and left sides of the gate electrode 40c are a source electrode 40d and a drain electrode 40e connected to the source and drain regions, respectively, via contact holes created in the interlayer insulation film 34. The upper ends of the source and drain electrodes 40d and 40e are positioned on the surface of the interlayer insulation film 34.

Also formed on the surface of the interlayer insulation film 34 are components such as metal wiring connecting the drain electrode 40e and the power line VL. A first planarization film 36 is further formed covering the interlayer insulation film 34.

A transparent electrode 50 composed of a material such as ITO and IZO is disposed over the first planarization film 36. An end of the transparent electrode 50 is connected to the source electrode 40d of the driving TFT 40 via a contact hole created in the first planarization film 36.

The transparent electrode 50 serves as the anode of the organic EL element. A metal cathode 58 is formed over the transparent electrode 50, while a hole transport layer 52, an organic emissive layer 54, and an electron transport layer 56 are disposed between the cathode and the anode. A second planarization film 60 is positioned contacting the peripheral portions and the sides of the transparent electrode 50.

As described above, the active layer 40a is arranged directly on the glass substrate 30, and the gate electrode 40c is formed on the gate insulation film 40b in a location above the active layer 40a. Further, the power line VL is formed on the interlayer insulation film 34 in a location above the gate electrode 40c. Accordingly, it is apparent that capacitance of the second TFT 40 can be increased by adopting capacitance increasing means involving modifying the shape of the active layer 40a, the gate electrode 40c, or the power line VL, or providing a semiconductor layer in the same layer level as the active layer, as explained above.

Although a p-channel TFT is used as the second TFT 40 in the above examples, an n-channel TFT may be alternatively employed. In such a case, an upper portion of the organic EL element is connected with a lower portion of the storage capacitor CS. Further, a discharging TFT is provided connecting the storage capacitor CS and a low-voltage power source. The discharging TFT is turned on during rewriting of data in the capacitor CS. This configuration is described in detail in Japanese Patent Application No. 2001-303768.

The order of the electrodes and the organic layers may be reversed, i.e. cathode, electron transport layer, organic emissive layer, hole transport layer and anode may be laminated on the TFT substrate in this order.

While the present invention is embodied in an organic EL panel in the above examples, a fluorescent display tube or a sensor may replace the organic EL element in a configuration of the present invention. When a sensor is used, a current is read out from the power line VL.

Although the storage capacitor CS alone is connected to the gate of the second TFT 40 in the above-described circuits, various circuits (or elements) such as a reset circuit and a memory circuit may also be connected. The connected elements maybe either active or passive elements.

What is claimed is:

1. A transistor circuit, comprising:
   a first transistor including a first terminal connected to a signal line, the first transistor being operated by receiving a selection signal at its gate; and
   a second transistor including a gate connected to a second terminal of the first transistor, the second transistor controlling an electric current related to a current-consuming or current-generating element; wherein
   transistor capacitance generated between the gate and a source or drain or channel area of the second transistor is no less than 5fF.

2. A transistor circuit as defined in claim 1, wherein
   a storage capacitor for storing electric charges is connected to the second terminal of the first transistor and the gate of the second transistor.

3. A transistor circuit as defined in claim 2, wherein
the signal line connected to the first terminal of the first transistor is a data line which supplies display data;
the current-consuming or current-generating element is an organic EL element; and
the second transistor supplies, from a power line to the organic EL element, an electric current in accordance with a voltage stored in the storage capacitor.

4. A transistor circuit, comprising:
a first transistor including a first terminal connected to a signal line, the first transistor being operated by receiving a selection signal at its gate;
a second transistor including a gate connected to a second terminal of the first transistor, the second transistor controlling an electric current related to a current-consuming or current-generating element; and
a storage capacitor for storing electric charges connected to the second terminal of the first transistor and the gate of the second transistor; wherein
transistor capacitance generated between the gate and a source or drain of the second transistor is no less than 5% of capacitance of the storage capacitor.

5. A transistor circuit as defined in claim 4, wherein
the signal line connected to the first terminal of the first transistor is a data line which supplies display data;
the current-consuming or current-generating element is an organic EL element; and
the second transistor supplies, from a power line to the organic EL element, an electric current in accordance with a voltage stored in the storage capacitor.

6. A transistor circuit, comprising:
a first transistor including a first terminal connected to a signal line, the first transistor being operated by receiving a selection signal at its gate; and
a second transistor including a gate connected to a second terminal of the first transistor, the second transistor controlling an electric current related to a current-consuming or current-generating element; wherein
the second transistor is capable of increasing transistor capacitance generated between the gate and a source or drain or channel area of the second transistor by enlarging, in a planer direction, a portion of a channel region of the second transistor, thereby expanding the channel region while maintaining its channel width and channel length.

7. A transistor circuit, comprising:
a first transistor including a first terminal connected to a signal line, the first transistor being operated by receiving a selection signal at its gate;
a second transistor including a gate connected to a second terminal of the first transistor, the second transistor controlling an electric current related to a current-consuming or current-generating element; wherein the second transistor is capable of increasing a transistor capacitance between the gate of the second transistor and a second terminal of the second transistor by enlarging, in a planer direction, a portion of a channel region of the second transistor, thereby expanding the channel region while maintaining a channel width of the channel region and a channel length; and
a storage capacitor for storing electric charges connected to the second terminal of the first transistor and the gate of the second transistor.

8. A transistor circuit, comprising:
a first transistor including a first terminal connected to a signal line, the first transistor being operated by receiving a selection signal at its gate;
a second transistor including a gate connected to a second terminal of the first transistor, the second transistor controlling an electric current related to a current-consuming or current-generating element; wherein the signal line connected to the first terminal of the first transistor is a data line which supplies display data;
the current-consuming or current-generating element is an organic EL element; and
the second transistor supplies, from a power line to the organic EL element, an electric current in accordance with a voltage stored in the storage capacitor; and
wherein the second transistor is capable of increasing a transistor capacitance between the gate of the second transistor and a second terminal of the second transistor by enlarging, in planer direction, a portion of a channel region of the second transistor, thereby expanding the channel region while maintaining a channel width of the channel region and a channel length.

9. A method for testing a transistor circuit, wherein the transistor circuit includes
a first transistor including a first terminal connected to a signal line, the first transistor being operated by receiving a selection signal at its gate; and
a second transistor including a gate connected to a second terminal of the first transistor, the second transistor controlling an electric current related to a current-consuming or current-generating element;
the testing method comprising:
setting voltage of the signal line to a predetermined voltage value;
in that state, turning on the first transistor such that the voltage of the signal line and gate voltage of the second transistor are set to the predetermined voltage value;
subsequently detecting a stored charge amount at the gate of the second transistor, so as to determine transistor capacitance of the second transistor; and
confirming operation of the second transistor based on the determined transistor capacitance.

10. A method as defined in claim 9, wherein the transistor capacitance is determined by performing detection in the signal line.

11. A method as defined in claim 10, wherein
a storage capacitor is connected to the gate of the second transistor, and
an amount of charges stored by the transistor capacitance is determined by subtracting an amount of charges stored in the storage capacitor from a sum amount of charges stored in both the storage capacitor and the transistor capacitance.

12. A method as defined in claim 9, wherein
the transistor capacitance is determined by performing detection in a power line connected to the second transistor.

* * * * *